United States Patent [19]

Campione

[11] Patent Number: 5,051,619

[45] Date of Patent: Sep. 24, 1991

[54] PREDRIVE CIRCUIT HAVING LEVEL SENSING CONTROL

[75] Inventor: Ben Campione, Palm Bay, Fla.

[73] Assignee: Harris Corporation, Melbourne, Fla.

[21] Appl. No.: 403,865

[22] Filed: Sep. 7, 1989

[51] Int. Cl.$^5$ ............... H03K 19/003; H03K 19/094; H03K 19/20; H03K 17/687

[52] U.S. Cl. ................... 307/443; 307/473; 307/475; 307/448; 307/451; 307/270

[58] Field of Search ............... 307/443, 542, 246, 242, 307/263, 270, 450–453, 475, 481, 571, 572, 577, 579, 581, 583, 584, 585, 592, 594, 597, 603, 605, 279, 272.1, 448, 473, 475, 448

[56] References Cited

U.S. PATENT DOCUMENTS

| | | | |
|---|---|---|---|
| 4,439,690 | 3/1984 | Maley et al. | 307/272.1 |
| 4,449,064 | 5/1984 | Eckert et al. | 307/270 X |
| 4,684,824 | 8/1987 | Moberg | 307/270 |
| 4,700,089 | 10/1987 | Fujii et al. | 307/585 X |
| 4,752,703 | 6/1988 | Lin | 307/585 X |
| 4,761,568 | 8/1988 | Stronski | 307/272.1 X |
| 4,798,972 | 1/1989 | Melanson et al. | 307/544 X |
| 4,806,786 | 2/1989 | Valentine | 307/272.1 X |
| 4,818,901 | 4/1989 | Young et al. | 307/585 X |

Primary Examiner—Stanley D. Miller
Assistant Examiner—David R. Bertelson

Attorney, Agent, or Firm—Evenson, Wands, Edwards, Lenahan & McKeown

[57] ABSTRACT

A circuit for predriving a signal conductor includes a logic circuit/level sensing control mechanism that prevents the simultaneous condition of switching devices through which the signal conductor is coupled to respective predrive voltage sources, thereby avoiding the establishment of a current path from a power supply source to ground. First and second controlled current flow paths are provided by way of first and second switching transistor circuits, that are coupled between first and second voltage reference sources, corresponding to first and second logic levels, respectively, and the signal conductor to be driven. To predrive the conductor, the current flow path through one of the transistor circuits is gated on, while the current flow path through the other transistor circuit is interrupted. At the same time the flow of current between the other voltage source and the signal conductor is inhibited, as the signal conductor is brought to an intermediate voltage level. The voltage level on the signal conductor is sensed continuously. Upon the voltage level of the signal conductor being brought to the intermediate voltage level, the current flow paths through both transistor circuits are interrupted, so that an unwanted current path through the predrive circuit cannot be established.

11 Claims, 2 Drawing Sheets

PREDRIVE CIRCUIT HAVING LEVEL SENSING CONTROL

FIELD OF THE INVENTION

The present invention relates in general to digital signal processing circuits, and is particularly directed to a circuit for predriving a signal conductor to a voltage level intermediate logic levels, between which the conductor is switched in the course of its operation with an attendant circuit, thereby improving signal processing speed.

BACKGROUND OF THE INVENTION

Output devices (e.g. buffer/drivers) for digital (CMOS) signal processing systems and components, such as high density CMOS arrays, must be sufficiently large to handle the substantial current requirements (including large current spikes) of attendant signal transmission circuits, which often include a high capacitance bus. Despite their increased size, however, these devices are still relatively slow in switching the bus from one logic level to another. One proposal to reduce logic level switching time is to predrive the bus by means of a circuit which switchably couples a pair of logic level reference potentials to a bus drive node and, in response to the onset of a voltage level transition, controllably gates a pair of switching devices, so as to drive the node, and thereby the bus, to a voltage level that is intermediate the destination logic level. Predriving the bus to this intermediate level immediately prior to an actual logic transition can substantially reduce the switching time from that required to complete a full logic level swing to a shorter period of time required to transit from the intermediate level to the destination voltage. Predriving significantly reduces ground spiking, which is a major system problem when many outputs are switching simultaneously. However, in the course of a predrive operation, it is often the case that both switching devices are rendered conductive simultaneously, thereby sinking current to ground. Consequently, although a dual switching device predrive circuit is capable of predriving the bus and thus able to substantially reduce output current spikes, it often consumes power unnecessarily.

SUMMARY OF THE INVENTION

In accordance with the present invention, the problem of unnecessary and wasted current flow in the operation of a dual switching device predrive circuit for predriving a signal conductor is obviated by a predrive logic circuit/level sensing control mechanism that prevents the simultaneous conduction of switching devices, through the controlled operation of which the conductor is coupled to respective predrive voltage sources, thereby avoiding the establishment of a current path from a power supply source to ground. Pursuant to the present invention, first and second controlled current flow paths are provided by way of first and second switching transistor circuits, that are coupled between first and second voltage reference sources, corresponding to first and second logic levels, respectively, and the signal conductor to be driven. To predrive the conductor, the current flow path through one of the transistor circuits is gated on, while the current flow path through the other transistor circuit is interrupted, thereby selectively enabling the flow of current between one of the voltage sources and the signal conductor. At the same time the flow of current between the other voltage source and the signal conductor is inhibited, as the signal conductor is brought to an intermediate voltage level. The voltage level on the signal conductor is sensed continuously. Upon the voltage level of the signal conductor being brought to the intermediate voltage level, the current flow paths through both transistor circuits are interrupted. Each transistor circuit includes a pair of cascaded transistors that are controllably gated in response to receipt of a prescribed enabling signal, so that a current flow path will be established through one pair of transistors for a period of time until the voltage level on the signal conductor reaches the intermediate voltage level and thereupon interrupted. In the absence of receipt of the enabling signal both transistor circuits are effectively gated off, so that no current is established between the voltage sources and the signal conductor. In the presence of the enabling signal, the voltage level on the signal conductor is monitored and a current flow path is established through the transistor pair that is connected to the destination voltage. When the signal conductor reaches the intermediate voltage level, the current flow path is interrupted. In addition, the other transistor pair is disabled, so that an unwanted current path through the predrive circuit cannot be established.

DETAILED DESCRIPTION

Figure 1:
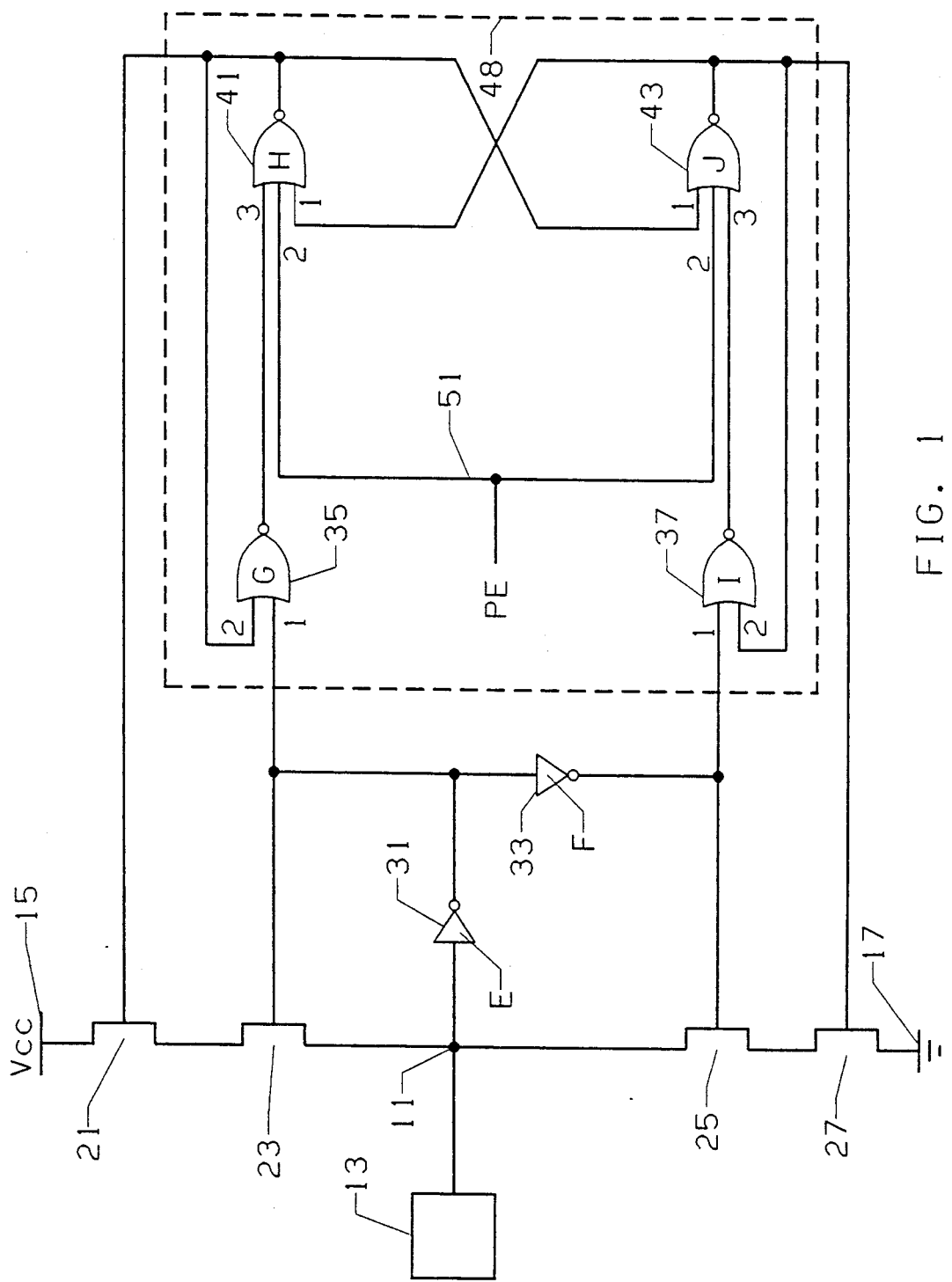
FIG. 1 diagrammatically illustrates the configuration of an embodiment of a predrive circuit having level sensing control in accordance with the present invention.

Referring now to FIG. 1, a predrive circuit having level sensing control in accordance with the present invention is diagrammatically illustrated as comprising a predrive terminal or node 11, which is coupled via a signal conductor 13 to a device such as a digital (CMOS) memory output pad or buffer, and a pair of voltage source terminals 15 and 17, respectively corresponding to logic level voltages (e.g. +5 V and ground) between which signal conductor 13 is switched in accordance with digital signals that are coupled over the conductor. Between terminal 15 and node 11 a pair of first and second N-channel MOSFETs 21 and 23 have their source-drain paths coupled in series, so that, when gated-on, MOSFETs 21 and 23 provide a current flow path between node 11 (and consequently signal conductor 13) and high (+V) voltage level terminal 15, and thereby cause node 11 to be driven toward the high voltage reference. Between terminal 17 and node 11 a pair of third and fourth N-channel MOSFETs 25 and 27 have their source-drain paths coupled in series, so that, when gated-on, MOSFETs 25 and 27 provide a current flow path between node 11 and low (ground) voltage level terminal 17, and thereby cause node 11 to be driven toward the low voltage reference.

Node 11 is further coupled to a first level sensitive inverter 31, the output of which is coupled to the gate of MOSFET 23, the input of a second level sensitive inverter 33, which is substantially identical to inverter 31, and a first input of NOR gate 35. The output of inverter 33 is coupled to the gate of MOSFET 25 and a first input of NOR gate 37. The output of NOR gate 35 is coupled to a first input of NOR gate 41, the output of which is coupled as a second input to NOR gate 35, to the gate of MOSFET 21 and as an input to NOR gate 43. The output of NOR gate 37 is coupled to a second input of NOR gate 43, the output of which is coupled as a second input to NOR gate 37, to the gate of MOSFET 27 and as a second input to NOR gate 41, so that NOR gates 35, 37, 41 and 43 form a cross-coupled Set-Reset latch surrounded by broken lines 48. Each of NOR gates 41 and 43 has a third input coupled to receive a predrive enable signal PE over line 51, from external control logic, not shown.

In the predrive circuit configuration of FIG. 1, inverters 31 and 33 are threshold sensitive to a predefined voltage level, so that they toggle in response to their inputs reaching that voltage and thereby provide a level sensitive control input to the operation of latch 48 and, consequently, MOSFETs 21, 23, 25 and 27. As a result, and as will be explained more fully below, the operation of the predrive circuit is controlled by both the level of the driven node and a predrive enable signal PE applied to line 51. In the absence of the predrive enable signal PE (line 51 going low), the outputs of both NOR gates 41 and 43 are held low, thereby keeping MOSFETs 21 and 27 OFF, preventing a predrive current flow path between each of reference terminals 15 and 17 and node 11.

For purposes of the following description of operation let it be assumed that each of inverters is sized to trigger at a voltage level of 1.5 volts and that signal conductor 13 (and thereby node 11) is initially at a high voltage level (e.g. some voltage greater than 1.5 volts (e.g. 5.0 volts). Since it has been assumed that node 11 is initially high, the next logic level excursion will be a high to low transition. Until the onset of that transition, predrive enable signal line 51 is high, and the output of each of NOR gates 41 and 43 of latch 48 is held low, thereby holding each of MOSFETs 21 and 27 OFF and isolating node 11 from voltage reference terminals 15 and 17. In addition, since node 11 is high, the output of inverter 31 is low, which causes a low voltage level to be applied to the gate of N-channel MOSFET 23, keeping MOSFET 23 OFF, so that each of MOSFETs 21 and 23 is turned OFF. The low output of inverter 31 is also applied to an input of NOR gate 35. Since the other input of NOR gate 35 is currently held low by NOR gate 41, the output of NOR gate 35 is high, so that two of the three inputs to NOR gate 41 are high.

The low output of inverter 31 causes inverter 33 to apply a high input to the gate of MOSFET 25 and an input of NOR gate 37. As a result, MOSFET 25 is turned ON, coupling node 11 to the drain of MOSFET 27, which is being held OFF by the low output of NOR gate 43. The high input to NOR gate 37 keeps its output low, so that NOR gate 43, like NOR gate 41 has a low logic level applied to two of its three inputs. Thus, in its present quiescent condition, the predrive circuit isolates node 11 from both of predrive terminals 15 and 17, by holding both NOR gates 41 and 43 of latch 48 low.

Figure 2:
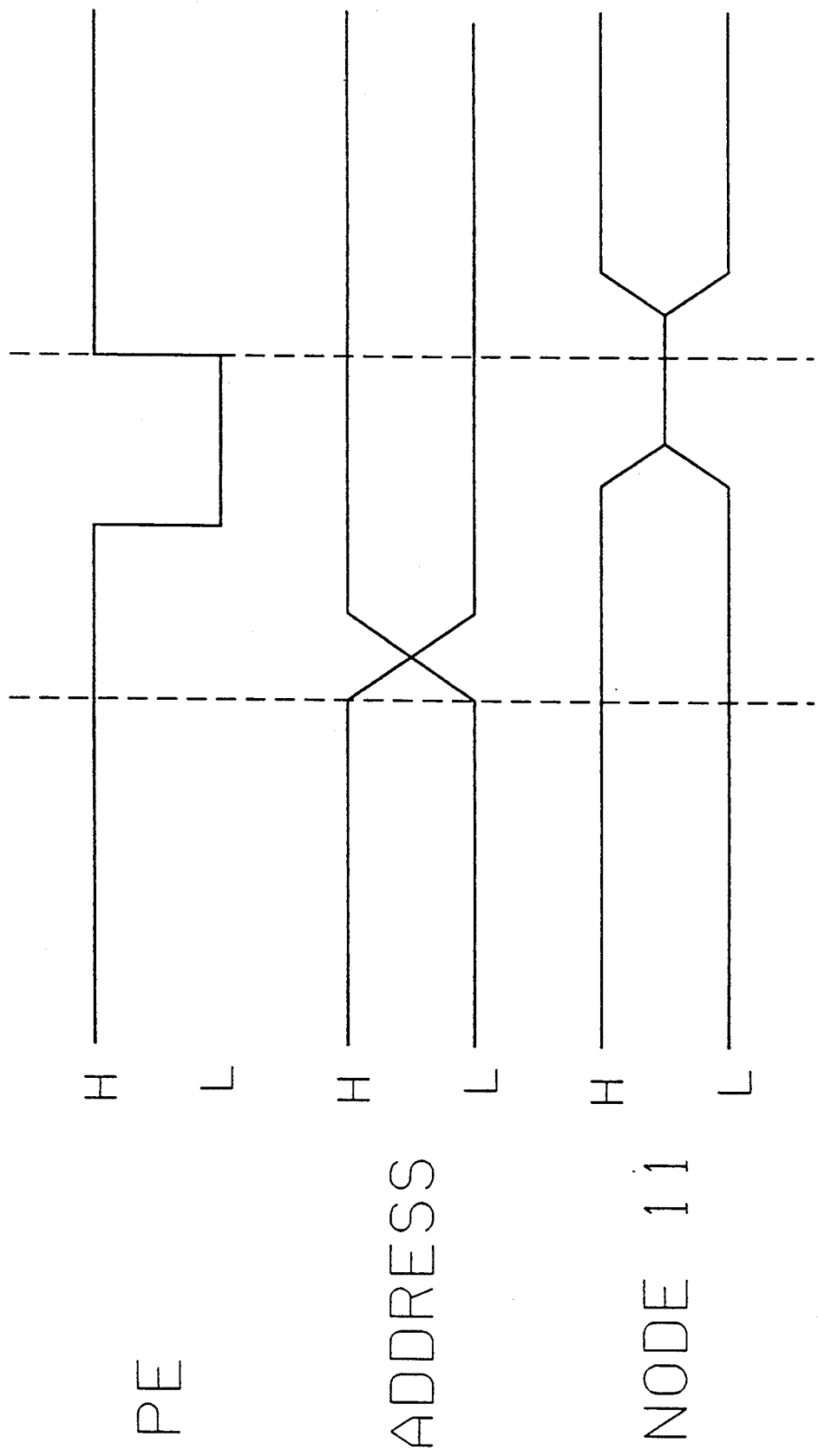
FIG. 2 is a logic level transition diagram associated with the operation of the predrive circuit of FIG. 1.

With reference to the logic level transition diagram of FIG. 2, in the course of a logic level transition Ox, such as following an address change or clock signal Ax in the signal processing system with which conductor 13 is associated, a low logic level predrive enable signal PE is coupled over line 51 to each of NOR gates 41 and 43. Recalling that the remaining inputs to NOR gate 43 were previously low, the output of NOR gate 43 now goes high, causing a high level to be applied to the gate of MOSFET 27, whereby MOSFET 27 conducts and a predrive current flow path is provided between node 11 and low voltage reference terminal 17. At the same time the high output of NOR gate 43 is coupled to NOR gate 37. Since the other input of NOR gate 37 is high, the output of NOR gate 37 is now held low, which keeps the output of NOR gate 43 high and MOSFET 27 conductive. The high output of NOR gate 43 also keeps the output of NOR gate 41 low and maintains MOSFET 21 OFF.

With both MOSFETs 25 and 27 conducting, node 11 is pulled from its current level (above 1.5 volts) toward the (low) voltage at terminal 17. Upon the potential at node 11 reaching the (1.5 volts) threshold voltage of inverter 31, the output of inverter 31 changes state, going from low to high, causing MOSFET 23 to conduct. However, since MOSFET is held OFF by latch 48, there is no current flow path between node 11 and terminal 15. This transition also causes the output of inverter 33 to change state from high to low, so that MOSFET 25 is turned OFF, thereby interrupting the predrive path through MOSFETs 25 and 27. Thus, even with a predrive enable low logic level applied over line 51 to latch 48, the sensitivity of inverters 31 and 33 to the voltage level at node 11 prevents predriving of the node once it has reached a prescribed intermediate voltage level. This aspect of the inventive predrive circuit is advantageous when signal conductor 13 is not at a CMOS high or low. Node 11 will be driven only from its existing voltage level to the preset intermediate voltage (1.5 volts in the present example).

When the predrive enable signal PE is reset to a logical high, the outputs of latch 48 are once again held low, keeping MOSFETs 21 and 27 OFF. Signal conductor 13 is then driven by its associated output circuit and transitions from its current predriven level of 1.5 volts to ground. Because node 11 has been predriven to voltage level intermediate the logic state representative levels of interest (e.g. +5.0 V and ground), switching time from that required to complete a full logic level swing is substantially reduced to a shorter period of time required to transit from the intermediate level to the destination voltage. As the predrive circuit prevents both switching MOSFET pairs from being rendered conductive simultaneously, thereby avoiding sinking current to ground. In addition, because the predrive circuit of the present invention does not alter normal circuit operation, it does not slow down critical speed paths.

In the foregoing explanation, it has been assumed that the logical state of node 11 was inintially high. For the case where its logical state is initially low, it is the upper pair of transistors of the circuitry shown in FIG. 1, namely MOSFETs 21 and 23, which are rendered conductive, while MOSFET 25 is held OFF by the low at the output of inverter 33. As a result, node 11 is pulled 'up' to the 1.5 V threshold setting of inverter 31, at which point each of inverters 31 and 33 changes state, turning MOSFET 23 OFF, and interrupting predrive current flow from terminal 15 to node 11. Again, when the predrive enable signal PE is reset to a logical high, the outputs of latch 48 are once again held low, keeping MOSFETs 21 and 27 OFF.

In those signal processing applications where switching times are more relaxed, the predrive enable signal PE may be used to gate the operation of level sensing inverters 31 and 33. In this case, the inverters may be configured as NOR gates, with a gate input to each NOR gate being driven by the predrive enable signal in line 51.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A circuit device for predriving a signal conductor, which is switched between first and second voltage levels in the course of operation of a circuit to which said signal conductor is coupled, to a third voltage level lying between said first and second voltage levels, so as to enhance the switching operation of said signal conductor between said first and second voltage levels comprising:

a first terminal for receiving a first reference potential, corresponding to said first voltage level;

a second terminal for receiving a second reference potential, corresponding to said second voltage level;

a third terminal to which the signal conductor to be predriven is coupled;

first means, coupled in circuit between said first and second terminals and said third terminal, for receiving a predrive enabling signal and, in response thereto, controllably providing a first current flow path between said third terminal and one of said first and second terminals, while preventing a second current flow path between said third terminal and the other of said first and second terminals, until the voltage level of said third terminal reaches said third voltage level, said third voltage level being independent of the level of said enabling signal, and thereupon interrupting said first current flow path, while continuing to prevent said second current flow path between said third terminal and the other of said first and second terminals.

2. A circuit device for predriving a signal conductor, which is switched between first and second voltage levels in the course of operation of a circuit to which said signal conductor is coupled, to a third voltage level lying between said first and second voltage levels, so as to enhance the switching operation of said signal conductor between said first and second voltage levels comprising:

first and second terminals to which said first and second voltage levels are applied;

a third terminal coupled to said signal conductor;

means, coupled in circuit between said first and second terminals and said third terminal, for receiving a predrive enabling signal and, in response thereto, controllably providing current flow between one of said first and second terminals and said third terminal, while preventing current flow therethrough between said first and second terminals, so as to bring the voltage level at said third terminal, and thereby said signal conductor, to said third voltage level, said third voltage level being independent of the level of said enabling signal, and thereupon interrupting current flow therethrough and preventing current flow between each of said first and second terminals and said third terminal.

3. A circuit device for predriving a signal conductor according to claim 2, wherein said means comprises first switching means, coupled between said first and third terminals for switchably controlling the establishment of a first current flow path therebetween, second switching means, coupled between second and third terminals for switchably controlling the establishment of a second current flow path therebetween, and control means, responsive to the voltage level at said third terminal and coupled to said first and second switching means, for causing that one of said first and second switching means, which is coupled to the one of said first and second terminals the voltage level on which is the voltage level to which said signal conductor is to be switched, to establish a current flow path therethrough until the voltage level at said third terminal reaches said third voltage level.

4. A circuit device for predriving a signal conductor according to claim 3, wherein said control means comprises means for monitoring the voltage level of said third terminal and being coupled to receive said predrive enabling signal, for causing said one of said first and second switching means to establish a current flow path therethrough for a time period initiated by said predrive enabling signal and terminating upon the voltage level of said third terminal reaching said third voltage level.

5. A circuit device for producing a signal conductor according to claim 2, wherein said control means comprises first and second controlled switching devices, current flow paths through which are coupled in series between said first and third terminals, third and fourth switching devices current flow paths through which are coupled in series between said second and third terminals, and means for monitoring the voltage level at said third terminal and being coupled to receive said predrive enabling signal, for interrupting current flow paths through said first and third controlled switching devices in the absence of said predrive enabling signal and, in response to receipt of said predrive enabling signal, for causing a current flow path to be established through one pair of said first and second switching devices and said third and fourth switching devices for a period of time until the voltage level of said third terminal reaches said third voltage level and thereupon interrupting the current flow path through said one pair of switching devices.

6. A circuit device for predriving a signal conductor according to claim 5, wherein said control means comprises means for preventing each of said first and third controlled switching devices from establishing a respective current flow path therethrough in the absence of receipt of said predrive enabling signal.

7. A circuit device for predriving a signal conductor according to claim 2, wherein said control means comprises a first pair of controlled switching devices formed of first and second switching devices current flow paths through which are coupled in series between said first and third terminals, and a second pair of controlled switching devices formed of third and fourth switching devices current flow paths through which are coupled in series between said second and third terminals, and means for monitoring the voltage level at said third terminal and coupled to receive said predrive enabling signal, for interrupting the current flow paths through first and second pairs of controlled switching devices in the absence of said predrive enabling signal and, in the presence of said predrive enabling signal, for causing a current flow path to be established through one of said pairs of controlled switching devices until the voltage level of said third terminal reaches said third voltage level and thereupon interrupting the current flow path through said one pair of controlled switching devices.

8. A circuit device for predriving a signal conductor according to claim 7, wherein said control means comprises first means, having an input coupled to said third terminal and first and second outputs respectively coupled to said second and fourth controlled switching devices, for rendering said second and fourth controlled switching devices respectively oppositely conductive and nonconductive in accordance with the voltage level of said third terminal.

9. A circuit device for predriving a signal conductor according to claim 8, wherein said control mean further comprises second means having first and second inputs respectively coupled to the first and second outputs of said first means, a third input coupled to receive said predrive enabling signal, and first and second outputs respectively coupled to said first and third controlled switching devices, for rendering one of said first and third controlled switching devices conductive while rendering the other of said first and third controlled switching devices nonconductive in the presence of said predrive enabling signal and in accordance with signal levels at the first and second inputs thereof as provided by the first and second outputs of said first means.

10. A circuit device for predriving a signal conductor according to claim 9, wherein said second means includes means for rendering both of said first and third controlled switching devices non-conductive in the absence of said predrive enabling signal.

11. A method of predriving a signal conductor, to which one or more CMOS devices are coupled, to an intermediate voltage level lying between first and second logic level voltages between which said signal conductor is switched in the course of coupling of logic signals with respect to said one or more CMOS devices, so as to enhance the speed with which said signal conductor is switched between said first and second logic levels, comprising the steps of:

(a) providing first and second controlled current flow paths first and second terminals from which first and second voltages, corresponding to said first and second logic levels, respectively, are supplied, to said signal conductor;

(b) generating a predrive enabling signal and thereby selectively enabling the flow of current between one of said first and second terminals and said signal conductor, while preventing the flow of current between the other of said first and second terminals and said signal conductor, so as to bring the voltage level of said signal conductor to said intermediate voltage level; and (c) upon the voltage level of said signal conductor being brought to said intermediate voltage level, said intermediate voltage level being independent of the level of said predrive enabling signal, preventing the flow of current, via said first and second controlled current flow paths, between each of said first and second terminals and said signal conductor.

* * * * *

REEXAMINATION CERTIFICATE (1940th)

United States Patent [19]

Campione

[11] B1 5,051,619

[45] Certificate Issued  Mar. 2, 1993

[54] PREDRIVE CIRCUIT HAVING LEVEL SENSING CONTROL

[75] Inventor: Ben Campione, Palm Bay, Fla.

[73] Assignee: Harris Corporation, Melbourne, Fla.

Reexamination Request:
No. 90/002,598, Feb. 10, 1992

Reexamination Certificate for:
Patent No.: 5,051,619
Issued: Sep. 24, 1991
Appl. No.: 403,865
Filed: Sep. 7, 1989

[51] Int. Cl.$^5$ ............... H03K 17/687; H03K 19/003; H03K 19/094; H03K 19/20
[52] U.S. Cl. .................................. 307/443; 307/448; 307/451; 307/473; 307/475; 307/270
[58] Field of Search ............... 307/443, 473, 270, 279, 307/272.1

[56] References Cited

U.S. PATENT DOCUMENTS 4,449,064  5/1984  Eckert et al. .................. 307/473

*Primary Examiner*—John S. Heyman

[57] ABSTRACT

A circuit for predriving a signal conductor includes a logic circuit/level sensing control mechanism that prevents the simultaneous condition of switching devices through which the signal conductor is coupled to respective predrive voltage sources, thereby avoiding the establishment of a current path from a power supply source to ground. First and second controlled current flow paths are provided by way of first and second switching transistor circuits, that are coupled between first and second voltage reference sources, corresponding to first and second logic levels, respectively, and the signal conductor to be driven. To predrive the conductor, the current flow path through one of the transistor circuits is gated on, while the current flow path through the other transistor circuit is interrupted. At the same time the flow of current between the other voltage source and the signal conductor is inhibited, as the signal conductor is brought to an intermediate voltage level. The voltage level on the signal conductor is sensed continuously. Upon the voltage level of the signal conductor being brought to the intermediate voltage level, the current flow paths through both transistor circuits are interrupted, so that an unwanted current path through the predrive circuit cannot be established.

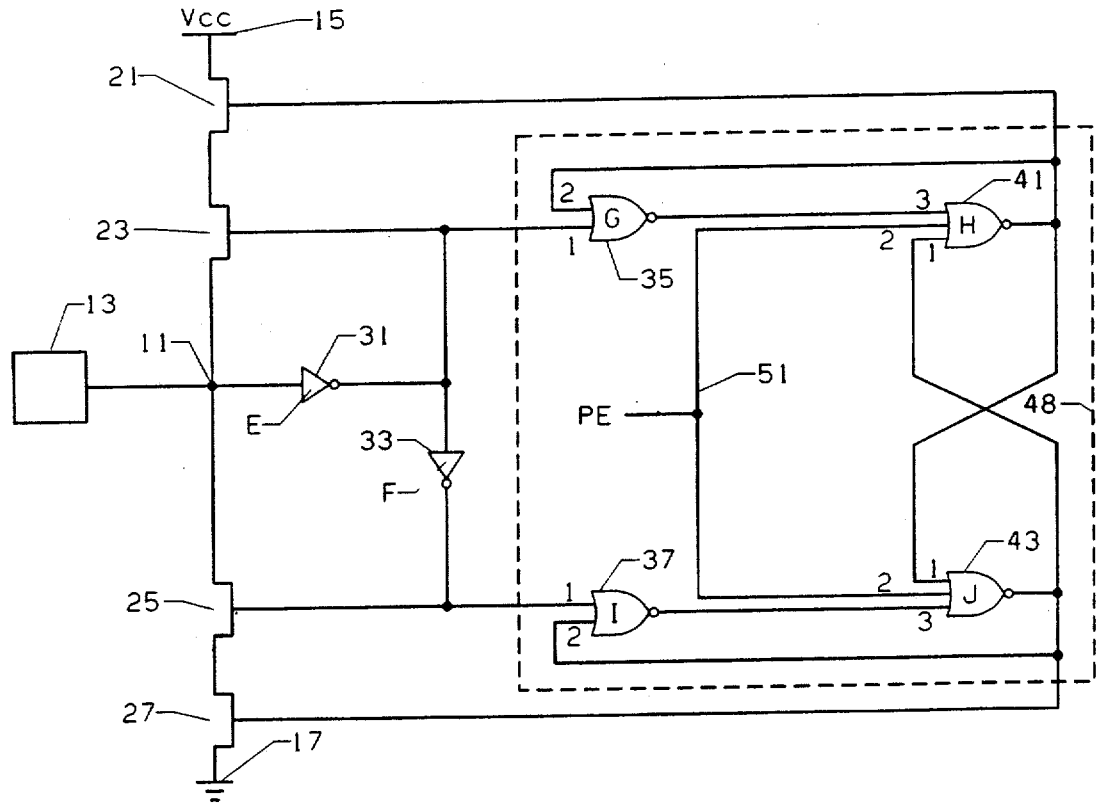

B1 5,051,619

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-9 and 11 are determined to be patentable as amended.

Claim 10, dependent on an amended claim, is determined to be patentable.

1. A circuit device for predriving a signal conductor, which is *capable of being controllably* switched [between] *to a* first *voltage level* and *to a* second voltage [levels] *level* in the course of operation of a circuit to which said signal conductor is coupled, to a third voltage level lying between said first and second voltage levels, so as to enhance the switching operation of said signal conductor [between] *to* said first *voltage level* and *to said* second voltage [levels] *level* comprising:

a first terminal for receiving a first reference potential, corresponding to said first voltage level;

a second terminal for receiving a second reference potential, corresponding to said second voltage level;

a third terminal to which the signal conductor to be predriven is coupled;

*a* first [means] *controlled switching circuit,* coupled in circuit between said first and second terminals and said third terminal, [for receiving] *which is operative to receive* a predrive enabling signal and, in response thereto, *to* controllably [providing] *provide* a first current flow path between said third terminal and *either* one of said first and second terminals, while preventing a second current flow path between said third terminal and the other of *either of* said first and second terminals, until the voltage level of said third terminal [reaches said third voltage level, said third voltage level being independent of the level of said enabling signal,] *is brought to a voltage level that is independent of the level of said predrive enabling signal* and thereupon interrupting said first current flow path, while continuing to *maintain the voltage level of said third terminal at a voltage level that is independent of the level of said predrive enabling signal and to* prevent said second current flow path between said third terminal and the other of *either of* said first and second terminals, *so that, in response to said predrive enabling signal, said third terminal is brought to neither of said first and second voltages, but, instead, to a voltage level that is independent of the level of said predrive enabling signal and wherein the voltage level to which said third terminal is brought and at which said third terminal is maintained, while said first current flow path is interrupted and said second current flow path is continued to be prevented, corresponds to said third voltage level.*

2. A circuit device for predriving a signal conductor which is *capable of being controllably* switched [between] *to a* first *voltage level* and *to a* second voltage [levels] *level* in the course of operation of a circuit to which said signal conductor is coupled, to a third voltage level lying between said first and second voltage levels, so as to enhance the switching operation of said signal conductor [between] *to* said first *voltage level* and *to said* second voltage [levels] *level* comprising:

first and second terminals to which said first and second voltage levels are applied;

a third terminal coupled to said signal conductor;

[means] *a controllable switching circuit* coupled in circuit between said first and second terminals and said third terminal, [for receiving] *which is operative to receive* a predrive enabling signal and, in response thereto, *to* controllably [providing] *provide* current flow between *either* one of said first and second terminals and said third terminal, while preventing current flow therethrough between said first and second terminals, so as to bring the voltage level at said third terminal, and thereby said signal conductor to [said third] *a* voltage level[, said third voltage level being] *that is* independent of the level of said *predrive* enabling signal, and thereupon interrupting current flow therethrough, *maintaining the voltage level of said third terminal at a voltage level that is independent of the level of said predrive enabling signal* and preventing current flow between each of said first and second terminals and said third terminal, *so that, in response to said predrive enabling signal, said third terminal is driven to neither of said first and second voltage levels, but, instead, to a voltage level that is independent of the level of said predrive enabling signal, and wherein the voltage level to which said third terminal is brought and at which said third terminal is maintained, while current flow is prevented between each of said first and second terminals and said third terminals, corresponds to said third voltage level.*

3. A circuit device for predriving a signal conductor according to claim 2, wherein said [means] *controlled switching circuit* comprises *a* first switching [means] *circuit,* coupled between said first and third terminals for switchably controlling the establishment of a first current flow path therebetween, *a* second switching [means] *circuit,* coupled between second and third terminals for switchably controlling the establishment of a second current flow path therebetween, and *a* control [means] *circuit,* responsive to the voltage level at said third terminal and coupled to said first and second switching [means] *circuits,* for causing that one of said first and second switching [means] *circuits,* which is coupled to the one of said first and second terminals the voltage level on which is the voltage level to which said signal conductor is to be switched, to establish a current flow path therethrough until the voltage level at said third terminal reaches said third voltage level.

4. A circuit device for predriving a signal conductor according to claim 3, wherein said control [means comprises means for monitoring] *circuit is operative to monitor* the voltage level of said third terminal and [being] *is* coupled to receive said predrive enabling signal, for causing said one of said first and second switching [means] *circuits* to establish a current flow path therethrough for a time period initiated by said predrive enabling signal and terminating upon the voltage level of said third terminal reaching said third voltage level.

5. A circuit device for producing a signal conductor according to claim 2, wherein said control [means] *circuit* comprises first and second controlled switching devices, current flow paths through which are coupled in series between said first and third terminals, third and fourth switching devices current flow paths through which are coupled in series between said second and third terminals, and [means for monitoring] *wherein said control circuit is operative to monitor* the voltage level at said third terminal and [being] *is* coupled to receive said predrive enabling signal, for interrupting current flow paths through said first and third controlled switching devices in the absence of said predrive signal and, in response to receipt of said predrive enabling signal, for causing a current flow path to be established through one pair of said first and second switching devices and said third and fourth switching devices for a period of time until the voltage level of said third terminal reaches said third voltage level and thereupon interrupting the current flow path through said one pair of switching devices.

6. A circuit device for predriving a signal conductor according to claim 5, wherein said control [means comprises means for preventing] *circuit is operative to prevent* each of said first and third controlled switching devices from establishing a respective current flow path therethrough in the absence of receipt of said predrive enabling signal.

7. A circuit device for predriving a signal conductor according to claim 2, wherein said control [means] *circuit* comprises a first pair of controlled switching devices formed of first and second switching devices current flow paths through which are coupled in series between said first and third terminals, and a second pair of controlled switching devices formed of third and fourth switching devices current flow paths through which are coupled in series between said second and third terminals, and [means for monitoring] *wherein said control circuit is operative to monitor* the voltage level at said third terminal and *is* coupled to receive said predrive enabling signal, for interrupting the current flow paths through first and second pairs of controlled switching devices in the absence of said predrive enabling signal and, in the presence of said predrive enabling signal, for causing a current flow path to be established through one of said pairs of controlled switching devices until the voltage level of said third terminal reaches said third voltage level and thereupon interrupting the current flow path through said one pair of controlled switching devices.

8. A circuit for predriving a signal conductor according to claim 7, wherein said control [means] *circuits* comprises first means, having an input coupled to said third terminal and first and second outputs respectively coupled to said second and fourth controlled switching devices, for rendering said second and fourth controlled switching devices respectively oppositely conductive and nonconductive in accordance with the voltage level of said third terminal.

9. A circuit device for predriving a signal conductor according to claim 8, wherein said control [mean] *circuit* further comprises second means having first and second inputs respectively coupled to the first and second outputs of said first means, a third input coupled to receive said predrive enabling signal, and first and second outputs respectively coupled to said first and third controlled switching devices, for rendering one of said first and third controlled switching devices conductive while rendering the other of said first and third controlled switching devices non-conductive in the presence of said predrive enabling signal and in accordance with signal levels at the first and second inputs thereof as provided by the first and second outputs of said first means.

11. A method of predriving a signal conductor, to which one or more CMOS devices are coupled, to an intermediate voltage level lying between first and second logic level voltages between which said signal conductor is switched in the course of coupling of logic signals with respect to said one or more CMOS devices, so as to enhance the speed with which said signal conductor is switched between said first and second logic levels, comprising the steps of:

(a) providing first and second controlled current flow paths first and second terminals from which first and second voltages, corresponding to said first and second logic levels, respectively, are supplied, to said signal conductor;

(b) generating a predrive enabling signal and thereby selectively enabling the flow of current between *a selected* one of *either of* said first and second terminals and said signal conductor, while preventing the flow of current between the other of said first and second terminals and said signal conductor, so as to bring the voltage level of said signal conductor to [said intermediate] *a* voltage level *that is independent of the level of said predrive enabling signal*; and (c) upon the voltage level of said signal conductor being brought to said [intermediate] voltage level[, said intermediate voltage level being] *that is* independent of the level of said predrive enabling signal, preventing the flow of current, via said first and second controlled current paths, between each of said first and second terminals and said signal conductor, *so that, in response to said predrive enabling signal, said signal conductor is driven to neither of said first and second voltage levels, but, instead, to a voltage level that is independent of the level of said predrive enabling signal and wherein the voltage level to which said signal conductor is brought, while current flow is prevented via said first and second controlled current flow paths between each of said first and second terminals and said signal conductor, corresponds to said third voltage level.*

* * * * *